(12) United States Patent
Aritsuka et al.

(10) Patent No.: US 10,300,639 B2
(45) Date of Patent: May 28, 2019

(54) IMPRINT METHOD, AND IMPRINT APPARATUS FOR IMPLEMENTING THE SAME

(71) Applicant: DAI NIPPON PRINTING CO., LTD., Tokyo (JP)

(72) Inventors: Yuki Aritsuka, Tokyo (JP); Naoko Nakata, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 414 days.

(21) Appl. No.: 15/063,909

(22) Filed: Mar. 8, 2016

(65) Prior Publication Data

US 2016/0185019 A1  Jun. 30, 2016

Related U.S. Application Data

(62) Division of application No. 13/423,844, filed on Mar. 19, 2012, now Pat. No. 9,316,904.

(30) Foreign Application Priority Data

Mar. 29, 2011  (JP) .................................. 2011-071772

(51) Int. Cl.
*B29C 43/58* (2006.01)
*G03F 7/00* (2006.01)
(Continued)

(52) U.S. Cl.
CPC .............. *B29C 43/58* (2013.01); *B82Y 10/00* (2013.01); *B82Y 40/00* (2013.01); *G03F 7/0002* (2013.01);
(Continued)

(58) Field of Classification Search
CPC ............ B29C 43/58; B29C 2043/5833; B29C 2043/5866; B29C 33/62; B05D 3/12; B05D 3/067; B05D 1/42
See application file for complete search history.

(56) References Cited

U.S. PATENT DOCUMENTS

2009/0108483 A1  4/2009  Suehira et al.
2010/0072653 A1*  3/2010  Kawakami ............ B29C 43/003
                                                                     264/134
(Continued)

FOREIGN PATENT DOCUMENTS

JP  2007-326367 A  12/2007
JP  2010-225683 A  10/2010

OTHER PUBLICATIONS

Landis et al. "Quantitative charaterizations of a nanopatterned bonded wafer: force determination for nanoimprint lithography stamp removal", Nanotechnology 19 (2008).

*Primary Examiner* — Joseph S Del Sole
*Assistant Examiner* — Emmanuel S Luk
(74) *Attorney, Agent, or Firm* — Oliff PLC

(57) ABSTRACT

An imprint method includes, in the peeling step of peeling a mold off the material layer to be transferred, a region-of-contact recognition operation of recognizing and determining a region of contact of the mold with the material layer to be transferred, a center-of-gravity locating operation of determining a center of gravity of a morphology of the thus recognized region of contact on the basis of that morphology, and a peeling operation of determining a point of force for applying peeling force to the mold or the imprinting substrate in relation to the center of gravity determined by the center-of-gravity locating operation, thereby acting the peeling force on the point of force.

1 Claim, 7 Drawing Sheets

(51) Int. Cl.
  *B82Y 10/00*    (2011.01)
  *B82Y 40/00*    (2011.01)
  *B05C 11/00*    (2006.01)
  *B05D 3/12*    (2006.01)
  *B05D 3/06*    (2006.01)
  *B05D 1/42*    (2006.01)
  *B29C 33/62*    (2006.01)
  *G03F 7/004*    (2006.01)
  *G03F 7/027*    (2006.01)

(52) U.S. Cl.
  CPC ............... *B05C 11/00* (2013.01); *B05D 1/42* (2013.01); *B05D 3/067* (2013.01); *B05D 3/12* (2013.01); *B29C 33/62* (2013.01); *B29C 2043/5833* (2013.01); *G03F 7/0046* (2013.01); *G03F 7/027* (2013.01)

(56) References Cited

U.S. PATENT DOCUMENTS

| | | | |
|---|---|---|---|
| 2010/0187714 A1 | 7/2010 | Kobiki et al. | |
| 2013/0207309 A1* | 8/2013 | Okada | B29C 33/424 264/293 |
| 2016/0031151 A1* | 2/2016 | Tan | B82Y 40/00 264/40.5 |
| 2016/0039126 A1* | 2/2016 | Tan | G03F 7/0002 264/40.5 |

* cited by examiner

IMPRINT METHOD, AND IMPRINT APPARATUS FOR IMPLEMENTING THE SAME

This is a Division of application Ser. No. 13/423,844 filed Mar. 19, 2012, which claims priority to Japanese Patent Application No. 2011-071772 filed Mar. 29, 2011. The disclosure of the prior applications are hereby incorporated by reference herein in their entireties.

BACKGROUND OF THE INVENTION

Field of the Invention

The present invention relates to an imprint method and an imprint apparatus for transferring and forming a desired pattern (such as lines, and graphic patterns) on the material to be transferred.

Description of the Related Art

Attentions have now been focused on imprint methods that are a sort of micro-machining or micro-processing technologies. A typical imprint method is a pattern-formation technique that uses a mold member having a minute concavo-convex structure formed on a substrate surface to transfer that concavo-convex structure to the material to be transferred, thereby achieving full-size transfer of that concavo-convex structure.

For such imprint methods, for instance, there has been a photo-imprint method or a thermal imprint method known in the art. In the photo-imprint method, for instance, a photo-curing resin layer having fluidity is located as the material to be transferred on a substrate surface, and a mold having the desired concavo-convex structure is engaged with that resin layer. In this state, the resin layer is then irradiated with light from the mold or substrate side to cure the resin, after which the mold is peeled off the resin layer so that the concavo-convex structure (concavo-convex pattern), where the concavities and convexities the mold has are inverted or flipped over, is formed on the resin layer that is the material to be transferred. In the thermal imprint method, a thermoplastic or thermosetting resin is used instead of the photo-curing resin. When the thermoplastic resin is used, the resin is softened by heating into a fluid state, and the mold is then engaged with the fluid resin to fill the resin up in the concavo-convex structure on the mold, after which cooling is carried out to pull the mold off the resin. For the thermosetting resin, heating is used as the means for engaging the mold with it and curing the resin filled up in the concavo-convex structure on the mold.

Thus, the imprint methods comprises the step of feeding the resin material that is the material to be transferred to the substrate surface, the step of filling the resin up in the concavo-convex structure on the mold, the step of curing the resin layer, and the step of peeling the mold off the resin layer.

For the step of peeling the mold off the resin layer among these steps, there is a technique demanded that enables the mold to be impeccably peeled off the resin layer while the morphology of the transferred resin concavo-convex structure (concavo-convex pattern) is kept intact. In general, a risk of inconvenient deposition of the resin that is the material to be transferred onto the mold, and a risk of mold breakdowns has correlations with the peeling force necessary for peeling: it would appear to be that the stronger the peeling force, the heavier the risks of deposition and breakdowns are.

A method of forming a releasing layer containing a fluorine component or the like on the concavo-convex surface of the mold has been proposed for use with the technique for achieving the aforesaid impeccable peeling (for instance, see JP(A) 2007-326367). In order to reduce drastic fluctuations of surface area rates, there has also been a method put forward, in which a dummy template pattern is formed to prevent the release rate from increasing drastically, thereby reducing the occurrence of defects (for instance, see JP(A) 2010-225683).

However, although the method of providing the releasing layer on the concavo-convex surface of the mold is very effective for where the area of contact of the mold with the resin layer is limited, it is to be understood that when the area of contact grows large for the purposes of boosted-up productivity or the like, the force necessary for peeling grows much stronger, so the simple provision of the releasing layer would be far away from the solution of a problem with peeling. Further, the prior art does not teach anything specific about any possible method that enables peeling with much less peeling force so as to avoid the occurrence of inconvenient deposition onto the mold of the resin that is the material to be transferred.

The aforesaid method of forming the dummy template pattern would also be far away satisfactory because even a portion of the pattern inessential in itself is transferred to the degree that such a peeling pattern has an adverse influence on later steps.

Having been accomplished with such situations in mind, the present invention has for its object to provide an imprint method that includes a specific peeling means that enables peeling with much less peeling force depending on the morphology of the material or material layer to be transferred thereby avoiding the occurrence of inconvenient deposition onto the mold of the material or material layer to be transferred.

SUMMARY OF THE INVENTION

In order to accomplish such an object, the invention provides an imprint method, comprising a transfer material layer formation step of interposing the material or material layer to be transferred between a surface of a mold having an concavo-convex structure region and an imprinting substrate to form a transfer material layer having a concavo-convex structure pattern, and a peeling step of peeling said mold off said material layer to be transferred, wherein:

said peeling step comprises a region-of-contact recognition operation of recognizing and determining a region of contact of said mold with said material layer to be transferred, a center-of-gravity locating operation of determining a center of gravity of a morphology of the thus recognized region of contact on the basis of said morphology, and a peeling operation of determining a point of force for applying peeling force to said mold or said imprinting substrate in relation to the center of gravity determined by said center-of-gravity locating operation, thereby acting the peeling force on the point of force.

In a preferable embodiment of the inventive imprint method, when there is said center of gravity lying within the region of contact, at least one point of force is located on a straight line including a line segment having the greatest length with said center of gravity and an outermost periphery of said region of contact as two ends.

In a preferable embodiment of the inventive imprint method, said point of force is located outside an area of the outermost periphery of said region of contact.

In a preferable embodiment of the inventive imprint method, when there is said center of gravity lying outside of said region of contact, an operation of capturing sub-centers of gravity in a graphic pattern (or a pattern) is implemented such that a morphology of the region of contact is divided into sub-regions so that the respective sub-centers of gravity are included and set in the respective sub-regions, and thereafter, said point of force is located on a straight line including a line segment having the greatest length with said sub-center of gravity and an outermost periphery of the sub-region of contact as two ends.

In a preferable embodiment of the inventive imprint method, the point-of-force locating operation is further implemented, and the obtained line segments are used as vectors with the sub-centers of gravity as origins to find a sum of said vectors, and the thus summed vector is drawn with the center of gravity as an initial point so that a point of force is set on an extension of that vector.

In a preferable embodiment of the inventive imprint method, in relation to the original center of gravity of the region of contact before being divided, said point of force is located at a position getting astride of the region of contact.

In a preferable embodiment of the inventive imprint method, when the peeling operation is implemented with points of force located at a plurality of sites, force in a direction opposite to a peeling direction is temporarily applied to a site where an internal angle of the region of contact exceeds 180° or a stress concentration site that is a site whose curvature takes on a negative value.

In a preferable embodiment of the inventive imprint method, the force in a direction opposite to a peeling direction is applied to a lower elasticity modulus one of both the mold and the substrate.

The present invention also provides an imprint apparatus, comprising:

a mold holder for holding a mold in place, a substrate holder for holding an imprinting substrate in place, a region-of-contact measuring instrument for recognizing and determining a region of contact with said mold of the material or material layer to be transferred that is interposed between a surface of the mold having an concavo-convex structure region and the imprinting substrate, and a data processing unit operable to execute computation and command tasks for controlling a state of the mold being peeled off the material layer to be transferred, wherein:

said data processing unit comprises a center-of-gravity computation portion for determining a center of gravity of a region of contact recognized by said region-of-contact measuring instrument, and a point-of-force computation portion for determining a point of force for applying peeling force to the mold or the imprinting substrate.

In a preferable embodiment of the inventive imprint apparatus, said mold holder or said substrate holder includes a peeler, wherein said peeler is operable to apply the peeling force to the point of force.

The inventive imprint method includes, and is comprised of, a resin layer formation step of interposing a material or material layer to be transferred between a surface of a mold having a concavo-convex structure region and an imprinting substrate to form the material layer to be transferred with a concavo-convex structure pattern, and a peeling step of peeling said mold off the resin layer, wherein the peeling step comprises a region-of-contact recognition operation of recognizing and determining a region of contact of the mold with the material layer to be transferred, a center-of-gravity locating operation of determining a center of gravity of the morphology of the thus recognized region of contact on the basis of said morphology, and a peeling operation of determining a point of force for applying peeling force to the mold or imprinting substrate on the basis of the determined center of gravity, thereby acting the peeling force on the point of force. The arrangement being like this, it is possible to implement peeling with much less peeling force depending on the morphology of the material or material layer to be transferred, thereby avoiding the occurrence of inconvenient deposition onto the mold of the material or material layer to be transferred.

DESCRIPTION OF THE PREFERRED EMBODIMENTS

Some embodiments of the invention will now be explained.

The inventive imprint method includes, and is constructed of, a transfer material layer formation step of interposing the material to be transferred that is a transfer material between a surface of a mold having a concavo-convex structure region and an imprinting substrate to form the material layer to be transferred with a concave-convex structure pattern, and a peeling step of peeling the mold off the material layer to be transferred. The material to be transferred that forms the material layer to be transferred here typically includes thermoplastic resins, and thermosetting resins in addition to the aforesaid photo-curing resins; however, it is noted that inorganic materials other than those resins may also be used. For instance, glasses such as quartz glass, soda lime glass and metal ion-containing glass are capable of being fluidized by heating. Further, mixtures of inorganic and organic materials may be used too. Materials composed mainly of silsesquioxanes as an example may be regarded as thermosetting or photo-curing materials depending on the materials to be contained in them, and silsesquioxane may just only be broken down into an inorganic material because of having a Si—O—Si skeleton, but may also be used in much the same way as the aforesaid thermosetting resins because it is capable of being fluidized and thermally set. If the silsesquioxane is allowed to contain photo-polymerizable groups such as oxetanyl or acryl groups, on the other hand, it may have photo-curability, so it may be used as a photo-curing resin.

By way of example but not by way of limitation, the invention is now explained with reference to a resin material as a preferable example of the material to be transferred.

[Imprint Method]

First of all, the imprint method is explained in details with reference to FIG. 1.

Among imprint methods known so far in the art, there are a photo-imprint method and a thermal imprint method. However, the photo-imprint method is here explained as one of the imprint methods.

Figure 1A:
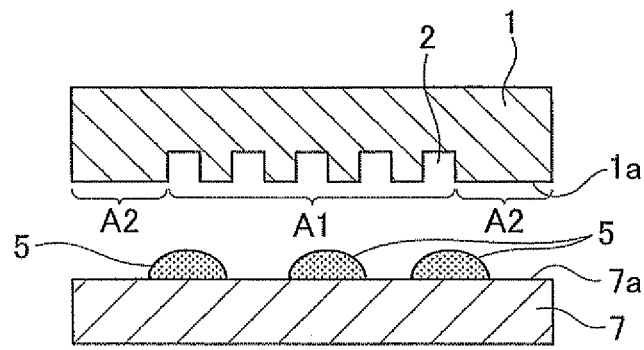
FIGS. 1A, 1B and 1C are illustrative in schematic and section over time of one example of the imprint method according to the invention.

In the photo-imprint method, a photo-curing resin material 5 is fed and located on a surface 7a of an imprinting substrate 7 as the material to be transferred, as shown typically in FIG. 1A. Feeders for the resin material 5 include a dispenser, an inkjet or the like. Although some droplets of the resin material 5 are shown, it is to be understood that the number and location of droplets of the resin material 5 may optionally be determined. Alternatively, the photo-curing resin material 5 may be formed as a uniform film on the surface 7a of the substrate 7 as by spin coating.

For instance, the imprinting substrate 7 may be constructed of glasses like quartz glass, soda lime glass, and borosilicate glass; semiconductors like silicon, gallium-arsenide, and gallium nitride; resin substrates like polycarbonate, polypropylene, and polyethylene; and metallic substrates or, alternatively, a composite material substrate comprising any combination of those materials. The substrate 7 is not necessarily flat; so it may be have a predetermined structure. For instance, the substrate 7 may have on it any desired pattern structure such as a micro-wire used for semiconductors, displays or the like, and an optical structure like a photonic crystal structure, a light guide, and a holographic structure. However, it is preferable that those structures do not stand in the way to transfer; that is, it is preferable that they are located in such a way as not to interfere with the morphology of the mold 1 and the concavo-convex structure the mold 1 has, or care is taken of how to transfer as by filling material up in concavities or recesses in the pattern structure to make it flat.

As shown in FIG. 1A, the mold 1 is located and provided opposite to the imprinting substrate 7. A surface 1a of the mold 1 is constructed of a concavo-convex structure region A1 having a concave structure comprising concavities 2 to be transferred, and a non-concavo-convex structure region A2 where there is none of the concavo-convex structure to be transferred. Although the structure to be transferred is shown as being concave with respect to the non-concavo-convex structure region A2, it is to be understood that the structure to be transferred may be convex or both convex and concave.

The mold 1 may be formed of any desired material; however, when the resin material 5 is photo-curing, the mold 1 is formed of a substrate transparent to light for curing the resin material 5. For instance, use may be made of glass like quartz glass, silicate glass, calcium fluoride, magnesium fluoride, and acryl glass, and resin like polycarbonate, polypropylene, and polyethylene, or any laminated material of these. However, when the substrate 7 is transparent to light for curing the resin material 5, the mold 1 is not necessarily formed of a transparent substrate; so use may be made of metals such as nickel, titanium, and aluminum, and semiconductors such as silicon, and gallium nitride. The mold 1 may have a thickness selected in consideration of the morphology of the concavo-convex structure, substrate strength, the ability of handle or the like, for instance, from the range of about 300 μm to 10 mm. The mold 1 may have a so-called mesa structure wherein the whole of the concavo-convex structure region A1 is convex relative to the non-concavo-convex structure region A2, and the mesa structure may have one or more steps.

Figure 1B:
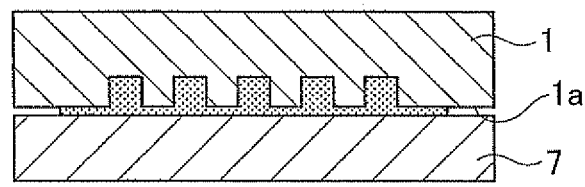
Figure 1C:
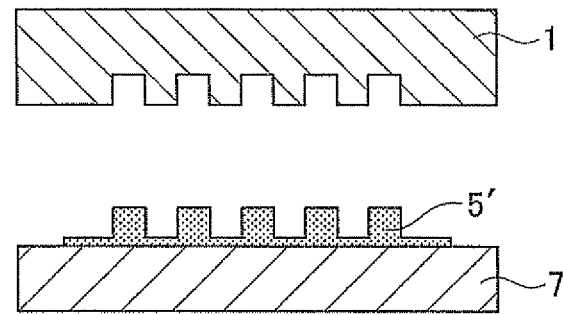

Then, as shown in FIG. 1B, the surface 1a of the mold 1 having the desired concavo-convex structure is brought in contact with the resin material 5 located in place, optionally with the application of pressure (the so-called mold forcing step). In this state, the resin material 5 turns to a resin layer having a concavo-convex structure, and the resin material 5 is cured by irradiation with ultraviolet radiation (the so-called resin curing step). Thereafter, the mold 1 is peeled off the resin material 5, as shown in FIG. 1C, whereby a resin layer 5' having an inverted concavo-convex structure of the concavo-convex structure the mold 1 has is transferred onto the imprinting substrate 7.

Part of the invention lies in the peeling step of peeling the mold 1 off the resin layer 5' wherein a specific peeling method is used to enable the mold 1 to be peeled off the transferred resin layer 5' with much less peeling force so that inconveniences such as deposition onto the mold of the resin to be transferred, and mold breakdowns can be avoided. The peeling step that is part of the invention is now explained.

[Explanation of the Peeling Step that is Part of the Invention]

The peeling step of the invention includes the region of contact recognition operation of recognizing and determining the region of contact of the mold with the resin layer, the center-of-gravity locating operation of determining the center of gravity of the morphology of the recognized region of contact of the resin layer on the basis of that morphology, and the peeling operation of determining the point of force for applying peeling force to the mold or imprinting substrate thereby applying the peeling force to that point of force.

First of all, the region-of-contact recognition operation is explained.

[Region-of-Contact Recognition Operation]

By implementing the region-of-contact recognition operation in the peeling step, the morphology of the region of contact of the mold with the resin layer is recognized. The "region of contact" here is understood to refer to an overall region where the mold having a concavo-convex structure region pattern is in contact with the resin layer.

Referring to an example of the region-of-contact recognition operation, for instance, an actual region of contact may be measured as such. That is, the region where the mold is actually in contact with the resin layer to be transferred is directly measured by a region-of-contact measuring instrument. Although there are several recognition means or methods available, it is to be understood that preference is given to an optical measuring method. This may have correlations with the explanation of the apparatus to be described later, and it is here noteworthy that when the region-of-contact measuring instrument is used in combination with the optical method, the mold should preferably be constructed of a material transparent to electromagnetic waves for the reason of recognition by electromagnetic waves, and that a holder for that mold, a peeling device or the like should preferably be provided with an opening in the site necessary for measurement in such a way as not to shield off electromagnetic waves or formed of a material that does not shield off electromagnetic waves. For instance, when infrared radiation is used as the electromagnetic waves, the holder or the like may be constructed of a material transparent to infrared light such as silicon. When the electromagnetic waves used have a wavelength identical with or close to that of light for curing the resin, it is possible to implement the region-of-contact recognition step and the resin layer curing step at the same time so that the region of contact can be recognized without any increase in the step count. If the mold, the holder for the mold, the peelers or the like cut off electromagnetic waves, it is preferable that the region-of-contact measuring instrument is located on the substrate side.

More specifically, the region-of-contact recognition method using electromagnetic waves should preferably rely upon A: image capturing, and B: edge detection by light scattering as mentioned below.

A: Image Capturing

For instance, a CCD camera, lenses or the like are used as the region-of-contact measuring instrument to capture images of a portion where the mold is actually in contact with the resin layer to be transferred. Image resolution is dependent on the performance of optical parts such as lenses, and the number of pixels of the CCD, so it may optionally be selected depending on the precision of the end captured information, and so on. When the image resolution is affected by contrasts, it may be optimized by taking care of how to illuminate. No particular limitation is imposed on the light source and CCD camera, if they are capable of recognition of the region of contact. For the light source, use may be made of the one that is capable of giving out light to which shields such as the mold and holder are transparent, and permits the CCD camera to receive that light.

B: Edge Detection by Light Scattering

Use may also be made of the method that uses edge detection by light scattering to detect the contour (or outer edge) of a portion where the mold is in contact with the resin layer to be transferred.

For instance, a plane including a region of contact wherein the mold is in contact with the resin layer to be transferred is defined as the X-Y coordinate. Laser light operable as the region of contact measuring instrument is used to scan that region of contact plural times in the X-axis direction, for instance, while it is gradually shifted at minute pitches in the Y-axis direction. As a matter of course, the Y-axis direction scanning may be implemented instead of the X-axis direction scanning. If the light at this time is detected, it is possible to recognize the contour of the portion of contact where the mold is in contact with the resin layer to be transferred. To put it another way, changes in the state of light scattering or reflection, and changes in the state of light transmission are detected with respect to the edge that is the contour of that portion of contact. By way of example but not by way of limitation, the light emitting portion, and the light receiving portion may be located at a position where such changes are detectable.

Image resolution is contingent on scan pitches; so the scan pitch may optionally be selected such that the given resolution is obtainable. Laser spot size has an influence on resolution too; so the laser spot size may optionally be selected such that the given resolution is obtainable. For edge detection, it is preferable that there are distinctions in the reflection or transmission state; so influences of refractive index, reflectivity, and transmittance should preferably be taken into consideration too.

The prerequisite for both the aforesaid measuring methods is that in order to transmit the electromagnetic waves used for measurement from the region-of-contact measuring instrument to the mold to the resin layer to be transferred, there is an opening provided in the mold holder to keep open the upper portions of the mold and the resin layer to be transferred, or the mold holder and so on are constructed of a material that does not shield off electromagnetic waves. However, the invention is not limited to these; there may be a detection method C used: detection by sound waves (shock or impulse waves) that is capable of detecting the region of contact with no need for the formation of openings or the like, as mentioned below.

C: Detection by Sound Waves (Shock or Impulse Waves)

With shock waves that are an element for forming the region-of-contact measuring instrument, the contour of the portion of contact of the mold with the resin layer to be transferred can be recognized using their reflection off a discontinuous substance surface.

For instance, suppose now that from an ultrasonic generator (not shown) closely located nearly all over the upper surface of the mold 1 in the state depicted in FIG. 1B, ultrasonic waves are being generated from the upper surface of the mold 1 down toward the resin layer to be transferred (downward in the drawing sheet). Then, ultrasonic waves will be reflected off the discontinuous substance portion. In short, there is a difference in reflection intensity depending on whether a site where there is the resin layer on the lower surface of the mold 1 or a site where there is an air layer devoid of the resin layer. By detecting this difference, the contour of the region of contact is determined. Here note that if sound wave losses are negligible, it is not necessary to bring the ultrasonic generator and its associated detector in close contact with the mold or the resin layer to be transferred. For instance, they may be located indirectly with a fluid like water between them.

Preferably, the region-of-contact recognition operation using the aforesaid region-of-contact measuring instrument should be implemented every time pattern transfer is carried out; however, there is an exception. For instance, when the region of contact of the mold with the material to be transferred would always be expected to be uniform, the region-of-contact recognition operation may possibly be omitted, given the expected region. Also, when imprinting is implemented under the same conditions, it may be not necessary to apply the aforesaid region-of-contact recognition operation to all imprinting cycles. In this case, it is unnecessary to implement the region-of-contact recognition operation for each imprinting. Those cases implicate, rather than that the region-of-contact recognition operation does not take place for each imprinting, that the results of the region of contact recognition operation implemented once or several times during a plurality of imprinting cycles may have been applied to every other imprinting, and the region-of-contact recognition operation may have been implemented in the peeling step. Of course, even when imprinting is conducted plural times, the region-of-contact recognition operation may be left out if the region of contact of the mold with the material to be transferred could be expected in advance.

Once the region-of-contact recognition operation for recognizing and determining the morphology of the region of contact of the mold with the resin layer has been implemented as described above, the center-of-gravity locating operation is carried out to determine the center of gravity of the morphology of the region of contact of the mold with the resin layer on the basis of that morphology. The center-of-gravity locating operation is now explained.

[Center-of-Gravity Locating Operation]

The center-of-gravity locating operation is now set forth with reference to some specific examples of how to determine the center of gravity.

In the invention, how to determine the center of gravity is of vital importance because how to determine the point of force is based on correlations with the center of gravity. In geometric parlance, the center of gravity is defined the way that "when the region of contact is viewed as a single graphic pattern (or a pattern), the center of gravity is described as the point where linear moment around that graphic pattern is zero". Generally for the determination of the center of gravity on the basis of such a definition, multiple integral is employed. When the density of the graphic pattern is regarded as being uniform, there is also a method using the exterior product of vectors. These calculation methods here are not expounded because of being generally well-known mathematical conception.

Therefore, there are some methods exemplified below that enable the center of gravity to be more easily figured out. These methods make it relatively easy to use the results of the already mentioned region-of-contact recognition operation; so they offer practically preferred method examples.

1. Method Approximating to a General Graphic Pattern

In this method, the results of measurement of the morphology of the region of contact are compared with simple graphic patterns for which how to determine the center of gravity is generalized, and the most approximate one is picked. For instance, the method is carried out according to the following order (a), (b) and (c).
  (a) Information about the region of contact is captured in. The results of the aforesaid region-of-contact recognition operation are employed.
  (b) The most approximate graphic pattern is selected from the data base.
  (c) The center of gravity of the selected graphic pattern is determined according to the definition.

Figure 2A:
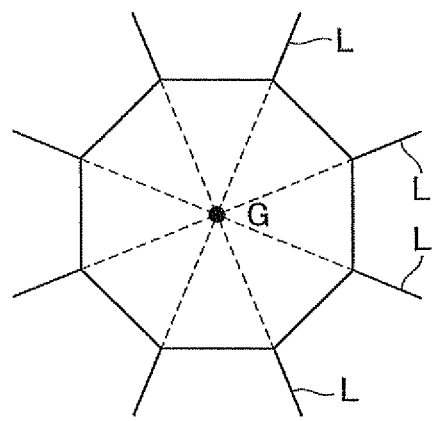
FIGS. 2A, 2B, 2C and 2D are plan views for illustrating the positions of the centers of gravity for a variety of graphic patterns.

Specifically, when it comes to the polygon shown in FIG. 2A, there is the center of gravity G at equal distances from the respective apexes. When it comes to a circle, there is the center of gravity at its center, and when it comes to the ellipse depicted in FIG. 2B, there is the center of gravity G at the point of intersection of the major and minor axes. When it comes to the parallelogram depicted in FIG. 2C, there is the center of gravity G at the point of intersection of diagonal lines. When it comes to the deformed quadrilateral depicted in FIG. 2D, the centers of gravity $A_1$ and $A_2$ of two triangles bisected by a diagonal line A, and the centers of gravity $B_1$ and $B_2$ of two triangles bisected by a diagonal line B are determined so that the center of gravity G of that deformed quadrilateral is determined by the point of intersection G of a straight line that connect $A_1$ and $A_2$ and a straight line that connect $B_1$ and $B_2$.

2. Polygon Approximation 1: Method for Determining the Center of Gravity from the Coordinates When a plane including the region of contact of the mold with the resin layer to be transferred is expressed in terms of the X-Y coordinates with any arbitrary point defined as the origin, there is a method available wherein there are the coordinates obtained for the peripheral portion of the region of contact, and the center of gravity is determined by making approximation to a polygon having the obtained coordinate data as apexes. This method is applicable to where coordinates $(X_1, Y_1), (X_2, Y_2), \ldots (X_i, Y_i), \ldots (X_n, Y_n)$ for the peripheral portions of the region of contact are obtained. Consider now that the periphery of the region of contact is represented by connecting these coordinates by line segments in adjoining order, and suppose that S is the area of the polygon obtained by connecting the coordinates by straight lines. Then, the center of gravity $(X_g, Y_g)$ is given by the following equations.

$$X_g = (1/6S)\Sigma(X_i + X_{i+1})(Y_i X_{i+1} - X_i Y_{i+1})$$

$$Y_g = (1/6S)\Sigma(Y_i + Y_{i+1})(X_i Y_{i+1} - Y_i X_{i+1})$$

where S is the area of the polygon created by connecting the coordinates with straight lines.

3. Polygon Approximation 2: Method for Determining the Center of Gravity from the Area of a Unit Graphic Pattern When a plane including the region of contact of the mold with the resin layer to be transferred is expressed in terms of the X-Y coordinates with any arbitrary point defined as the origin, there is a method available wherein the region of contact is considered as being an approximate of a set of graphic patterns, each one having a certain area. For instance, suppose now that n squares, each one having a certain area A, are spread all over the region of contact, and the graphic pattern has an area S (=nA). Then, the center of gravity $(X_g, Y_g)$ is given by the following equations.

$$X_g = (1/S)\Sigma AX_i$$

$$Y_g = (1/S)\Sigma AY_i$$

[Method of Determining the Point of Force where Peeling Force is Applied to the Mold or the Imprinting Substrate]

In the invention, the determination of the point of force where peeling force is applied to the mold or the imprinting substrate (the determination of the position where force acts) is made on the basis of correlations with the aforesaid center of gravity of the region of contact.

It is to be noted that the determination of the point of force varies in terms of how to deal with between cases where there is the center of gravity inside and outside the region of contact, so it is now explained with reference to two such cases.

(How to Determine the Point of Force when the Center of Gravity Lies within the Region of Contact)

Figure 3A:
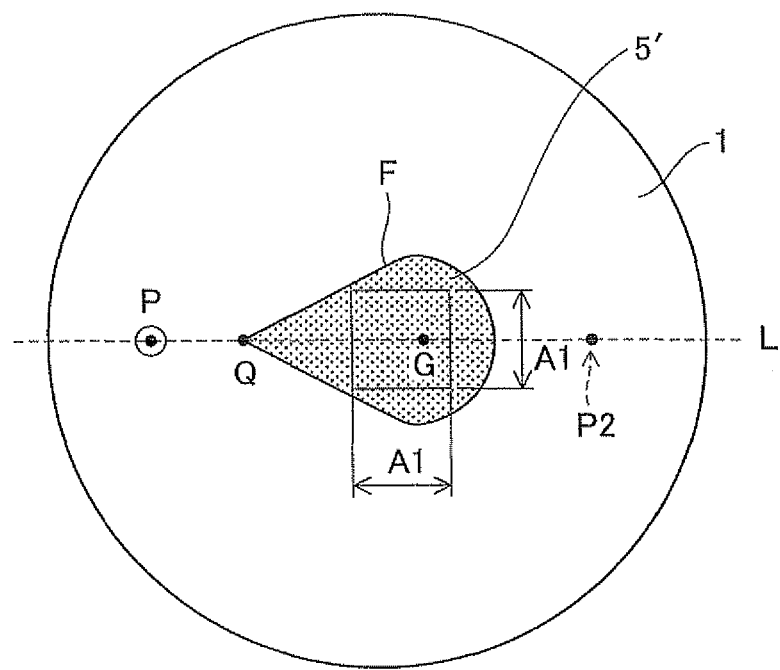
FIG. 3A is a plan view for illustrating how to set a point of peeling force in the case where the center of gravity G of the region of contact lies within the region of contact.
Figure 3B:
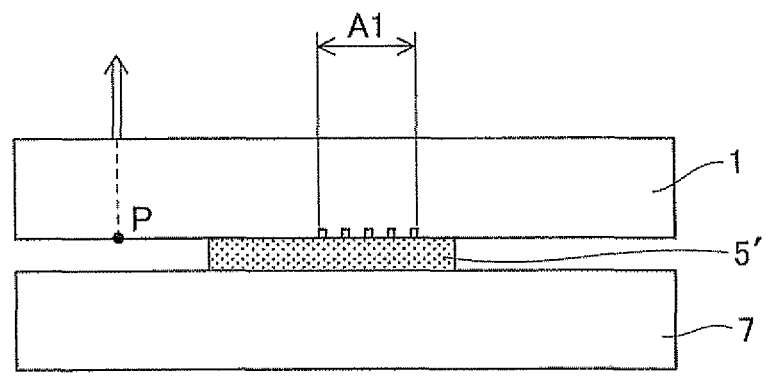
FIG. 3B is a side view of FIG. 3A.

FIG. 3A is a plan view for the illustration of how to set the point of peeling force where the center of gravity G of the region of contact lies within the region of contact, and FIG. 3B is a side view of FIG. 3A.

Referring to FIG. 3A, a mold 1 is constructed of a transparent material as an example, so that a resin layer 5' can be viewed directly through the mold 1. A region indicated by A1 in FIG. 3A, and FIG. 3B is a concavo-convex structure region of the mold provided with concavities (the portion where there is a so-called graphic pattern).

As depicted in FIG. 3A, when there is the center of gravity G of the region of contact (here synonymous to the center of gravity G of the resin layer 5') within the region of contact, at least one point of peeling force according to the invention is located on a line segment having the greatest length with the center of gravity G and the outermost periphery F of the region of contact (here synonymous to the outer frame shape F of the resin layer 5') as two ends, viz., a straight line L including a line segment GQ in the morphology shown in FIG. 3A.

In order to implement efficient peeling, it is particularly desired that the point of peeling force is set outside the outermost periphery F area of the region of contact. In the example depicted in FIG. 3A, the point of force P is determined further outside the point Q of the line segment GQ, and peeling (upward) force is applied to that point of force P. If peeling takes place first through the line segment GQ having the greatest length, it is then possible to concentrate the force on one point on the outermost periphery of the region of contact, pulling the trigger of peeling with small force but with ease and for sure. Although the peeling force is shown as being applied to the mold 1 side, it is to be understood that the peeling (downward) force may be applied to the imprinting substrate 7 side or both the mold 1 and the imprinting substrate 7 instead.

Pursuant to the aforesaid law, there may be two or more points of force set. In the example depicted in FIG. 3A, for instance, another point of force P2 may be set on the straight line L including the line segment GQ and in a direction opposite to the point of force P. However, it is to be noted that when the peeling force is applied to two points of force: P and P2 with the region of contact interposed between them, there is a risk that excessive stress may act on a single point of the resin 5' at the end of the peeling operation, because the site, at which the peeling operation gets completed, lies halfway the region of contact. When the site, to which excessive stress is applied, matches with the portion A1 having the pattern, there is a possibility of doing damage to the pattern. It is thus preferable that stress is controlled such that the site, at which the peeling operation gets completed, is off the portion A1 having the pattern. When there is no option but to allow the peeling operation to get completed at the portion A1 having the pattern, it is preferable that well managed stress control is implemented such that the necessary and minimum stress is applied at the end of the peeling operation.

Although it is preferable that the point of force is set as far from the center of gravity as possible for the efficient application of force, yet it would also be necessary to take into account how to retain the apparatus, mold shape, substrate shape, etc.

Referring back to FIG. 2 with reference to which the position of the center of gravity G is explained, a supplemental explanation is provided of a variation of how to determine the point of force for the application of peeling force. With such a regular octagon as depicted in FIG. 2A, there are four straight lines L on which the point of force may be set: one at the minimum and eight at the maximum. Given eight straight lines lying on the straight line L and extending outwardly of the region of contact, the "maximum number" here is understood to refer to the number of points of force in the case where a single point of force is provided per one straight line. In other words, when two or more points of force are provided per one straight line, the maximum number varies correspondingly. Generally given a regular N-gon, there is a variation in the number of straight lines L on which the points of force may be set depending on whether N is an even or odd number. When N is an even number, the number of straight lines L on which the points of force may be set becomes N/2, and when N is an odd number, the number of straight lines L on which the points of force may be set becomes N.

Figure 2B:
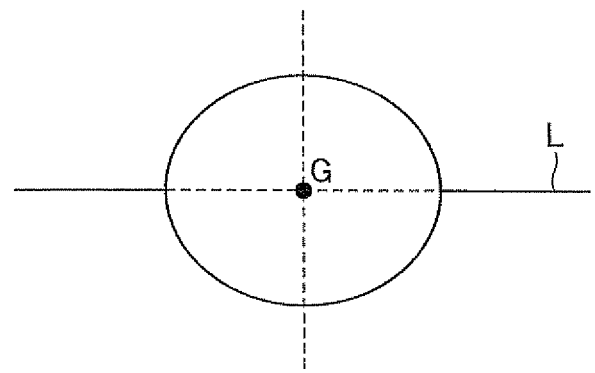
Figure 2C:
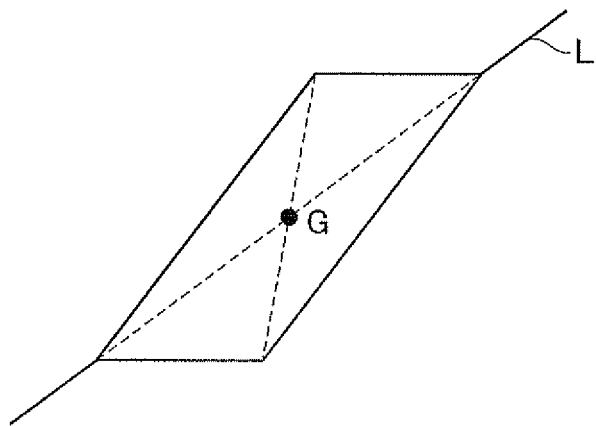
Figure 2D:
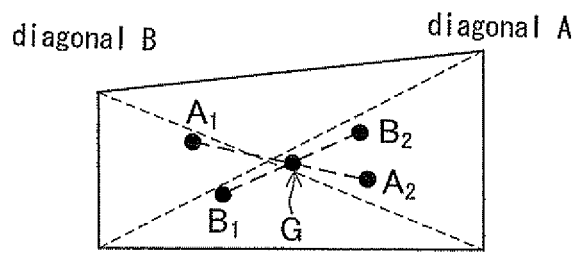

With such an ellipse as shown in FIG. 2B, the major axis matches with a line segment on the straight line L with the point of force set on it and within the region of contact. One point of force is provided at the minimum, and two at the maximum. With such a parallelogram as depicted in FIG. 2C, the longer of the orthogonal lines matches with a line segment of the straight line L with the point of force set on it and within the region of contact. One point of force may be provided at the minimum, and two at the maximum.

How to determine the point of force when there is no center of gravity found within the region of contact is now explained.

(How to Determine the Point of Force when there is No Center of Gravity Found within the Region of Contact)

How to determine the point of force when there is no center of gravity found within the region of contact is explained with reference to FIG. 4.

Figure 4A:
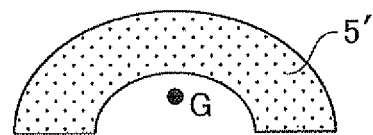
FIGS. 4A to 4E are illustrative over time of how to determine the point of force in the case where the center of gravity of the region of contact does not lie within the region of contact.

When, as shown in FIG. 4A as an example, the center of gravity G lies outside of the region of contact (e.g., the resin layer 5'), there are the following operations (a), (b) and (c) implemented, whereby the region of contact is divided into sub-regions; the respective sub-centers of gravity are included in the respective sub-regions (operation of capturing the sub-centers of gravity in the graphic pattern); and the respective sub-centers of gravity are set in the respective sub-regions.

Figure 4B:
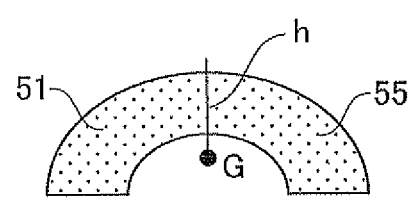

First of all, as shown in FIG. 4B, (a) a line segment h is drawn with the center of gravity G and the periphery of the area of the region of contact 5' as two ends. More specifically, the drawing operation is implemented such that the area ratio of sub-regions of contact 51 and 55 bisected by the line segment h is substantially 1, i.e., the region of contact 5' is bisected by the line segment passing through the center of gravity G into two sub-regions of contact 51 and 55. The "substantially 1" here is understood to mean that when the areas of the sub-regions of contact 51 and 55 are indicated by A51 and A55, the value of $[(A51-A55)/A51] \times 100$ falls within the range of ±10%. When the number of sub-regions of contact is greater than 2, the aforesaid value figured out of the maximum and minimum area values of each sub-region of contact may fall within the range of ±10%. The number of divisions may optionally be set for the reasons to be given later.

Figure 4C:
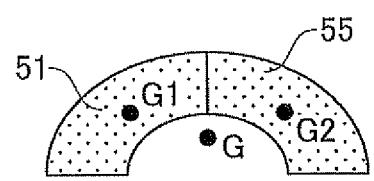

Then, as shown in FIG. 4C, (b) an operation is implemented to recalculate the centers of gravity of the sub-patterns (the sub-centers of gravity) for the respective two sub-regions of contact 51 and 55, thereby determining the sub-center of gravity G1 of the sub-region of contact 51 and the sub-center of gravity G2 of the sub-region of contact 55. In the example of FIG. 4C, the sub-centers of gravity are already included in the region of contact at this point in time; in other words, the operations (a) and (b) get completed. When the sub-centers of gravity are not yet included in the sub-regions of contact in one operation, however, the operations (a) and (b) are repeated as an operation (c) until the sub-centers of gravity are included in the sub-regions of contact.

As described previously, however, there may also be an option of arbitrarily setting the number of divisions in the first division operation without recourse to such a repetitive division operation, thereby dispensing with the operation for re-dividing the sub-patterns. The method of setting the number of divisions in the first place has a merit of equivalently dealing with the state of contact with the mold all over the divisions, because the sub-regions of contact have substantially equal areas as a consequence.

Figure 4D:
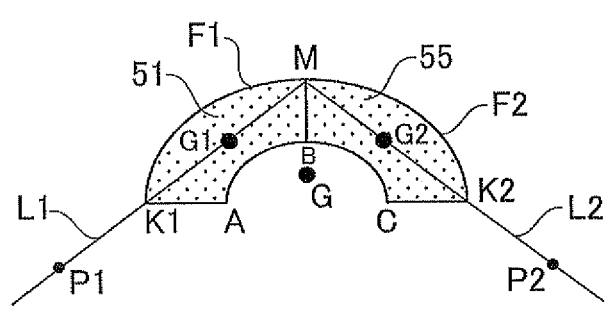

By contrast, the method of repeating bisection has a merit of obtaining the minimum number of centers of gravity. As described previously, the sub-centers of gravity G1 and G2 are included in the respective sub-regions of contact 51 and 55. Thereafter, as shown in FIG. 4D, a point of force may be set on a straight line L1 including line segments G1-K1 and G1-M having the greatest length with the sub-center of gravity G1 and the outermost periphery F1 of the sub-region of contact 51 as two ends. It is here to be noted that the less the centers of gravity, the less the process loads on the calculation of the point of force becomes. Although the graphic patterns drawn in a set of FIG. 4 inclusive of FIG. 4D are not precise, FIG. 4D is drawn as a graphic pattern wherein the line segment L1 passes through K1 and G1, and the line segment G1-K1 is equal to the line segment G1-M. Indeed, however, another force of point may be set on an extension from the line segment G1-M, too, although not illustrated.

Again, there may be a point of force set on a straight line L2 including line segments G2-K2 and G2-M having the greatest length with the sub-center of gravity G2 and the outermost periphery F2 of the sub-region of contact 55 as two ends. Although the graphic patterns drawn in a set of FIG. 4 inclusive of FIG. 4D are not precise, FIG. 4D is drawn as a graphic pattern wherein the line segment L2 passes through K2 and G2, and the line segment G2-K2 is equal to the line segment G2-M. Indeed, however, another force of point may be set on an extension from the line segment G2-K, too, although not illustrated.

In the embodiment depicted in FIG. 4D, there are two points of force P1 and P2 set. More specifically, one point of force P1 is set on the straight line L1 and at a site outwardly of point K2, and another P2 is set on the straight line L2 and at a site outwardly from point K2. Only one of the points of force P1 and P2 may be used or, alternatively, the remaining one may be sorted out, as mentioned above.

Although how to divide the graphic pattern has so far been explained, it is to be understood that there are some other methods, by which the same results as shown in FIGS. 4A, 4B and 4C are obtained. For instance, when the region of contact is taken as being a polygon, suppose that the region of contact is approximated as a graphic pattern wherein some polygons have a side sharing. Then, a simpler method may be used to determine the center of gravity of each polygon.

Figure 4E:
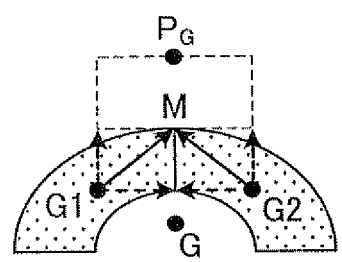

The specification of setting the point of force shown in FIG. 4D may be further extended to a more preferable one for setting the point of force as shown in FIG. 4E.

According to the specification of setting the point of force as shown in FIG. 4E, there are vectors obtained with the sub-centers of gravity of the obtained line segments G1-M and G2-M as the origins. Suppose now that the initial points of the vectors are the centers of gravity G1 and G2, and the terminal point is M that is the periphery of the region of contact. Then, the sum of the vectors is found. When the thus obtained vector is drawn with the center of gravity G of a graphic pattern (matches with the original pattern in FIG. 4) as the initial point, which graphic pattern is obtained by combining together the patterns having the centers of gravity G1 and G2, respectively, a point $P_G$ as an example may be set as a point of force on an extension of that vector. It is preferable that the point of force $P_G$ thus lying at one single site is located in a certain relation to the center of gravity G of the original region of contact before division, i.e., in such a way as to get astride of the region of contact.

Next, the state of peeling where the peeling force is being applied to two points of force P1 and P2 depicted in FIG. 4D is compared with the state of peeling where the peeling force is being applied to the point of force $P_G$ depicted in FIG. 4E.

Figure 5:
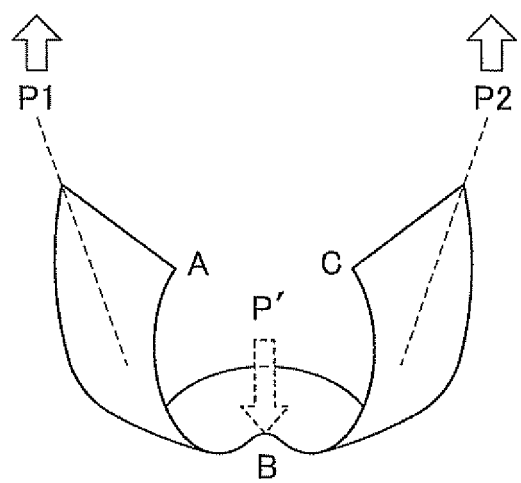
FIG. 5 is illustrative in perspective of an operation of temporarily applying a force P' in a direction opposite to a peeling direction to a stress concentration site where the internal angle of the region of contact exceeds 180 degrees.

In the former state of peeling wherein the peeling force is being applied to two points of force P1 and P2 (see FIG. 4D), as forces P1 and P2 are applied as depicted in FIG. 5, portions of the resin layer gradually peeled off the two sites direct from A toward B, and from C toward B. The then inside bending line ABC provides a site whose curvature takes on a negative value near point B. The "curvature" here is a reciprocal of the radius of curvature, indicating the ratio at which the tangent vector of the pattern is bending. That this value is negative indicates that when force applied from outside the region of contact is applied to the periphery of the region of contact, the force component matches with a site inward of the region of contact, and when, as shown in FIG. 5, forces acting from two directions are not uniform and there is torsion in the force acting on the periphery of the region of contact, excessive peeling stress is added to near the point B, resulting in possible breakdowns in the material being peeled in one or multiple points of the periphery of the region of contact where the points A, B and C link together. To avoid this, it is preferable to implement an operation of temporarily applying force P' in the direction opposite to the peeling direction to a site where the curvature of the region of contact takes on a negative value, as depicted in FIG. 5. In this case, the opposite force P' may be plural in number. This may in turn enable the resin layers being slowly peeled off in both peeling directions to merge together timely at the stress concentration site or point B. At the point of timely confluence, the opposite force P' is removed, and peeling keeps going on. When the peeling force acts on two points of force P1 and P2, therefore, breakdowns in the resin layer at the site of confluence are highly unlikely.

The opposite force P' may be applied to one or both of the mold and the substrate, because it is applied for the purpose of the timely confluence of the resin layers at the stress concentration site or point B. However, when the side having a higher elasticity modulus has much difficulty following the side that has a lower elasticity modulus and so distorts more upon receiving the same stress, the opposite force P' should preferably be applied to the lower-modulus member of both mold and substrate members. Where peeling goes toward completion, it is preferable to gradually decrease the opposite force P'.

Figure 6:
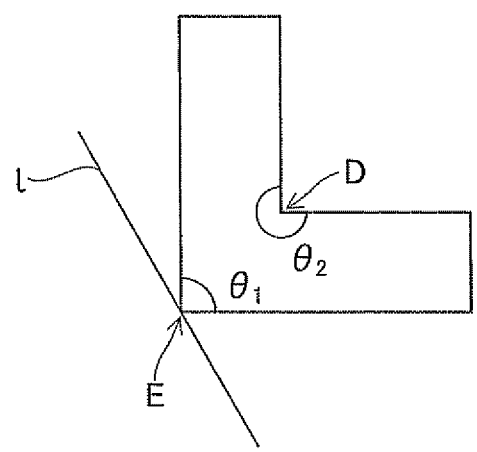
FIG. 6 is a plan view of an L-shaped material, illustrating whether or not the internal angle corresponds to a site exceeding 180°.

This phenomenon could again happen even with a polygon. Referring to FIG. 6, there is a site at an apex D, where the internal angle of the region of contact exceeds 180°, and as shown in FIG. 5, this site matches with a stress concentration site where the force component applied from outside the region of contact directs to the inside of the region of contact. In short, the site to which the opposite force P' is to be applied may here be defined by a site whose curvature takes on a negative value or whose internal angle exceeds 180°.

Regardless whether the region of contact is a polygon or a curved line, or it is composed of an angle and a curved line, it is desired to find out the stress concentration site. Although this may be achievable in various ways, there is the simplest way to determine the stress concentration site by looking for a site of intersection of the region of contact and a tangent line drawn at any arbitrary point on the periphery of the region of contact. For instance, referring to an easy-to-understand example of FIG. 6 illustrative of an L-shaped resin layer, a line 1 that does not intersect the region of contact may be drawn at a position of point E (with an internal angle θ1) (which does not correspond to a site having an internal angle of greater than 180°), but a line that does not intersect the region of contact cannot be drawn at a position of point D (with an internal angle θ2) (which corresponds to a site having an internal angle of greater than 180°).

On the other hand, the latter specification for setting the point of force $P_G$ shown in FIG. 4E does not offer such a problem with the aforesaid specification for setting the point of force shown in FIG. 4D, dispensing with the operation of adding the opposite force P' that may be rather a surplus one. Thus, the specification for setting the point of force $P_G$ shown in FIG. 4E provides the optimum point of force for the application of the peeling force.

(How to Determine the Point of Force when there are Independent, Discrete Regions of Contact)

Figure 7:
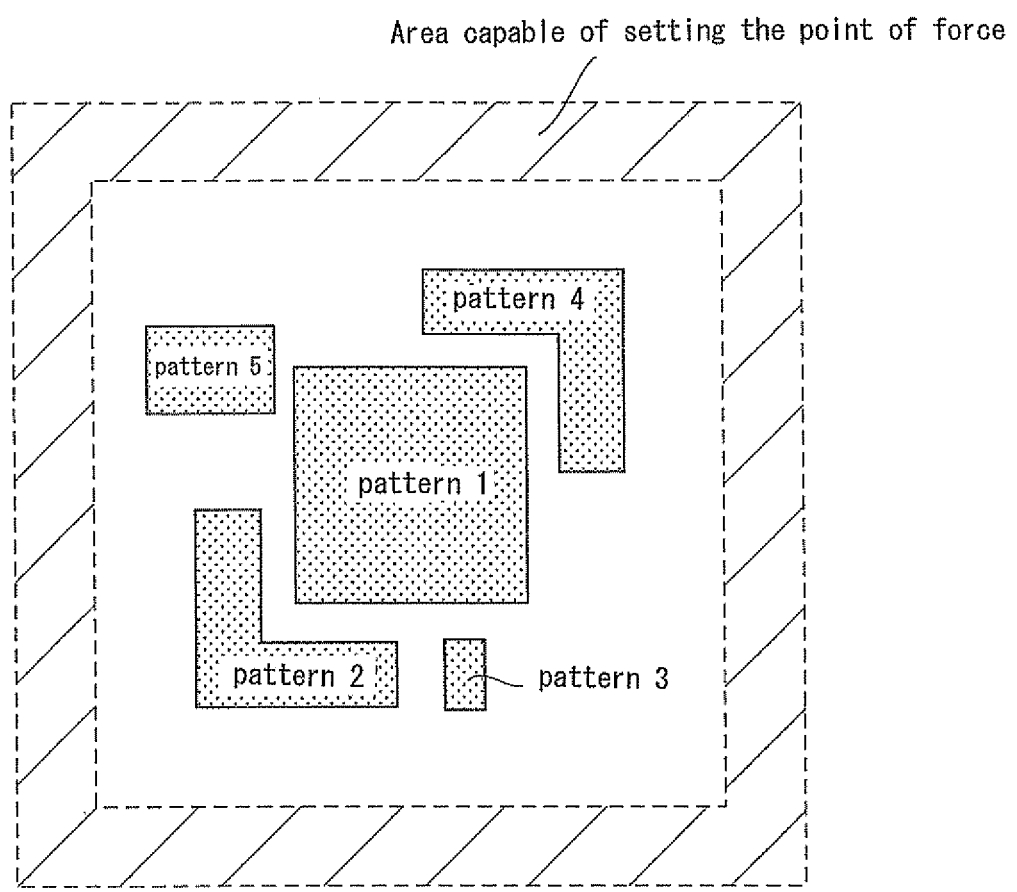
FIG. 7 is a plan view of a case where regions of contact do not come together, for instance, five regions of contact exist discretely.

How to determine the point of force when there is one region of contact has been described above. When there are five discrete regions of contact as shown in FIG. 7 as an example (five regions of contact are shown as graphic patterns 1 to 5) where they do not come together, that is, when a plurality of graphic patterns are included in a single one-shot mold, it is preferable to determine the point of force as follows.

(1) The precedence of the graphic patterns to be peeled off is determined. That is, the precedence of the pattern to be peeled off impeccably is determined.
(2) The center of gravity is figured out for each pattern to find a point-of-force candidate.
(3) It is preferable that the following operation is implemented with the obtained point-of-force candidates for the center of gravity to single out the optimum point of force. That is:

Points of force lying in regions unselected for the reason of the apparatus per se are excluded from the obtained point-of-force candidates to single out a selectable point of force.

Common features to the respective patterns are found, and the most frequently found common feature is defined as the point of force to which the largest force is to be applied.

When there are some candidates under the same conditions, a certain one is temporarily selected or, alternatively, precedence is given in advance to the patterns to pick one having higher priority.

However, the aforesaid method is given for the purpose of illustration alone, so the present invention is not limited thereto.

[Explanation of the Imprint Apparatus]

Figure 8:
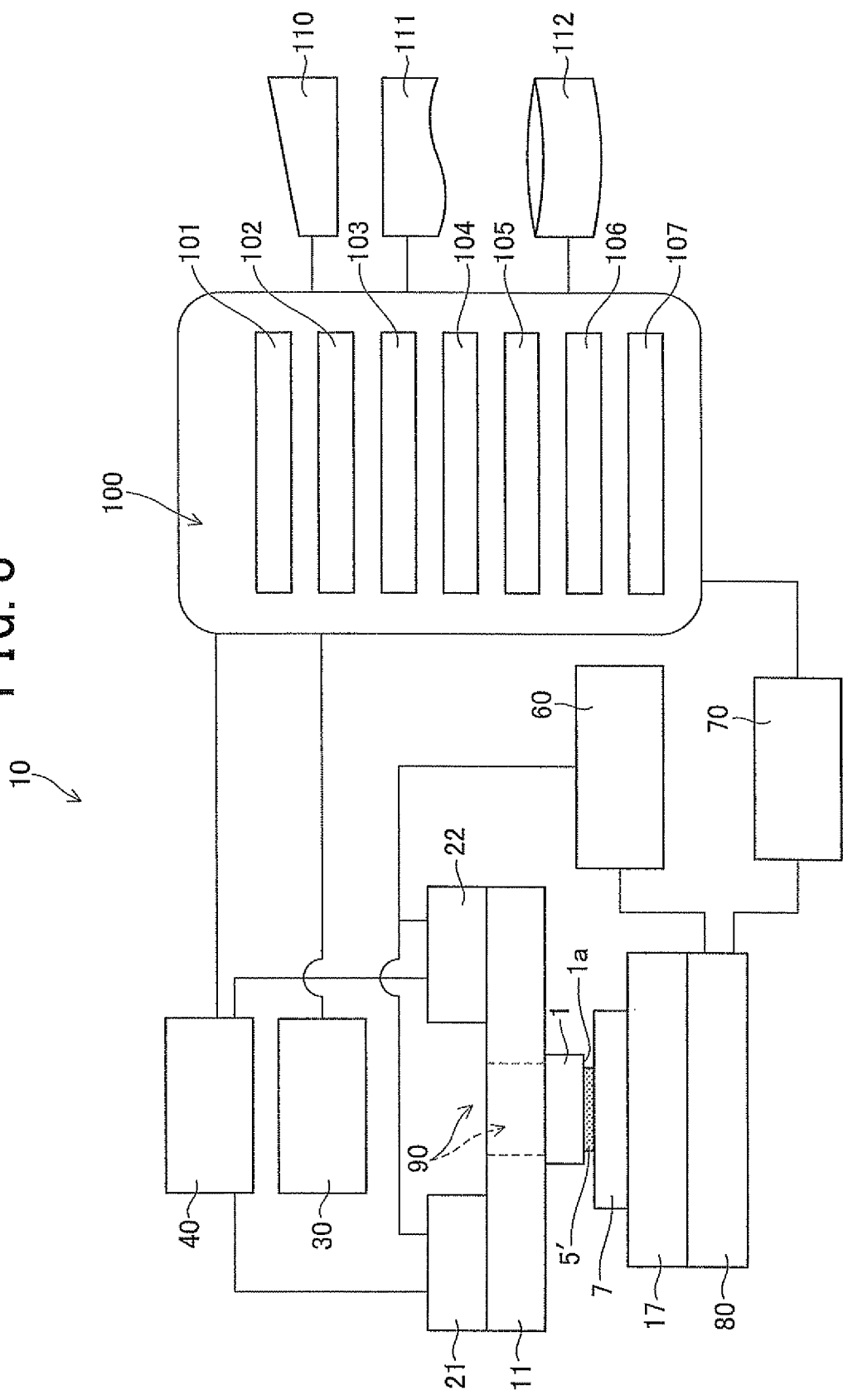
FIG. 8 is a front view of one example of the imprint apparatus.

One preferable example of the inventive imprint apparatus is shown in FIG. 8.

An imprint apparatus indicated generally by 10 includes a mold holder 11 operable to hold a mold 1 in place, a substrate holder 17 operable to hold an imprinting substrate 7 in place, a region-of-contact measuring instrument 30 operable to measure the region of contact with the mold 1 of a resin layer 5' to be transferred that is interposed between the mold 1 and the imprinting substrate 7, and a data processing unit 100 operable to execute primary tasks, say, computation and commands for controlling the state of the mold 1 being peeled off the resin layer 5'.

As described previously, the region-of-contact measuring instrument 30 may be constructed of, for instance, an image capturing device having a CCD camera, lenses or the like, a device capable of edge detection by light scattering, and a device capable of detection by sound (or shock) waves. Particular preference is given to an optical measuring method because of simplicity. With the region-of-contact measuring instrument making use of an optical measuring method, however, it is to be noted that for the reason that recognition is implemented with electromagnetic waves, the mold should preferably be formed of a light-transmitting material, and mold peelers 21 and 22, the mold holder or the like should preferably be provided with an opening 90 at the site necessary for measurement such that they do not cut off electromagnetic waves, as shown in FIG. 8. Of course, there is an exception where if the area to be irradiated with measuring electromagnetic waves for measurement is made of a material that does not shield off electromagnetic waves, such opening 90 may be dispensed with.

The data processing unit 100 includes a first computation block 103 having a center-of-gravity calculator for figuring out the center of gravity of the region of contact of the resin layer 5' recognized by the region-of-contact measuring instrument 30, and a second computation block 104 having a point-of-force calculator for determining the point of force for applying peeling force to the mold 1 or the imprinting substrate 7. Although the first 103 and the second computation block 104 are exemplified as being separate from each other for the purpose of illustration alone, it is to be understood that they may be combined into one single computation block.

The center-of-gravity locating operation at the center-of-gravity calculator for determining the center of gravity of the region of contact may be implemented, using an integral method, a method using the outer product of vectors, a method using an approximation to general graphic patterns, a method using a polygonal approximation plus coordinates, a method using an polygonal approximation plus unit pattern area or the like, as already described. At the point-of-force calculator for determining the point of force for the application of peeling force, calculation, settings and so on take place along the aforesaid point-of-force determination method depending on whether there is the center of gravity within the region of contact or there is none of the center of gravity within the region of contact.

As shown in FIG. 8, the peripheral edge of the plane (backside) of the mold holder 11 opposite to the side having the mold 1 held in place is provided with peelers 21 and 22, each built up of, for instance, an actuator, a spring and so on. For the reasons of space, only two peelers 21 and 22 are shown; however, it is usually desired that more peelers are provided almost all over the backside peripheral edge of the mold holder 11 so as to make the point-of-force setting area as wide as possible. If there can be the point-of-force setting area provided at a limited place alone, it is then possible to vary the holding positions of the mold and/or the substrate before peeling so that the force can be applied to the determined point of force. Such peelers 21 and 22 are operatively joined to a first stress measuring instrument 40 and a stress control unit 60, respectively. Upon peeling, the stress control unit 60 is operable to control the force applied to a given point of force determined by the peeling method of the invention, and the first stress measuring instrument 40 is operable to actually measure the force applied to the peelers 21 and 22 as well. It is here to be noted that the stress control unit 60 is also operatively joined to the pressurizer 80 to be described later to enable forces applied for just only peeling but also pressurization to be controlled as well; however, it may be provided independently for pressurization and peeling.

As shown at the lower portion of the drawing sheet of FIG. 8, the substrate holder 17 operable to hold the imprinting substrate 7 in place is operatively joined to the pressurizer 80. The pressurizer 80 is provided for the application of force opposite to the peeling operation, and built up of an actuator and springs, for instance. In the embodiment here, the force opposite to the peeling operation may be applied to any arbitrary site of the imprinting substrate 7 via the substrate holder 17. The pressurizer 80 is also operatively joined to the stress control unit 60 and a second stress measuring instrument 70, respectively. The stress control unit 60 is operable to control the pressurizing force (the force opposite to the peeling operation) produced out of the pressurizer 80, and the second stress measuring instrument 70 is operable to measure the force acting on the pressurizer upon pressurization. Such stress control unit 60 and such second stress measuring instrument 70 are operatively joined to the data processing unit 100 for the implementation of data processing, control, measurement, and so on.

In the embodiment here, the data processing unit 100 includes an input block 101 for receiving data from the respective measuring instruments 30, 40 and 70 and information from an input device 110, an recognition block 102 operable to recognize the outermost periphery area of the region of contact for data processing, a first computation block 103 operable to determine, for instance, the center of gravity of the region of contact from the outermost periphery area, and the state of stress acting on the peelers and puressurizer, a second computation block 104 operable to determine, for instance, the position of the point of force with respect to the center of gravity, and the stress to be applied to the peelers and puressurizer, a verification block 105 operable to verify whether or not there are errors in the respective operations within the data processing unit, an output block 106 operable to issue commands to the peelers and pressurizer, and send information out to an external output, and an internal memory block 107 operable to built up input data or obtained data.

Such data processing unit 100 is operatively connected to external devices such as input device 110, output device 111, and external memory device 112. The input device 110, for instance, is operable to enter data and commands in the data processing unit from outside. Given the input device 110, the point of force determined by another device may be sent out to the data processing unit 100 from the input device as the case may be, or information about the region of contact may be entered from the input device 110 into the data processing unit 100.

The output device 111, for instance, is operable to produce information out of the data processing unit, and the external memory device 112 is an external one operable to build up input data and obtained data, as is the case with the internal memory device.

Although one embodiment of the preferred imprint apparatus is shown in FIG. 8, it is to be understood that the inventive apparatus may be modified in various forms without being limited thereto. Although the peelers 21 and 22 are shown as being mounted on the mold 1 side as an example, it is understood that they may be mounted on the imprinting substrate 7 side or, alternatively, they may be mounted on both sides. Although the pressurizer 80 is shown as being mounted on the imprinting substrate 7 side as an example, it is to be understood that it may be mounted on the mold 1 side or, alternatively, it may be mounted on both sides. The peelers 21, 22 and the pressurizer 80 may be mounted on the same mold 1 side or the same imprinting substrate 7 side. The peelers 21, 22 may be integral with the molder holder 11. Likewise, the substrate holder 17 may be integral with the pressurizer 80.

Although the region-of-contact measuring instrument 30 is shown as being mounted on the mold 1 side, it is to be noted that it may be mounted on the substrate 7 side. The respective blocks in the data processing unit are operable to figure out both the region of contact and stress; however, they may separately be figured out.

There is an exception where if the region of contact of the mold with the material to be transferred is expected to be always uniform, the predetermined morphology of contact may have been entered in the data processing unit 100. In this case, the region-of-contact measuring instrument 30 is not always necessary. If the region-of-contact measuring instrument 30 is used, it can then be used as a tool for checking whether or not there is proper contact, or for the purpose of morphological recognition for correcting deviations from the predetermined morphology. These functional features may be mounted on the first computation block 103 or the recognition block 102.

Such entering of information in the data processing unit from outside could be highly probable. In short, the imprint apparatus shown in FIG. 8 is described such that every operation from the measurement of the region of contact to peeling is enabling. However, when it comes only to the case where the region of contact of the mold with the material to be transferred is expected to be always uniform, it is not always necessary for the recognition block 102, first computation block 103, second computation block 104 and verification block 105 to be built in the data processing unit 100; the results of calculation of the center of gravity and the point of force implemented outside of the apparatus may be given from the input device 110 to the data processing unit 100. In this case, the apparatus used for the external calculation of the center of gravity and the point of force may be taken as a part of the inventive imprint apparatus.

The inventive imprint apparatus includes a resin material feeder mechanism, although not shown. As shown in FIG. 1A as an example, this feeder mechanism is operable to feed a resin material 5 onto the imprinting substrate 7. Inkjet equipment may be exemplified as one example of the resin material feeder mechanism. Optionally, the feeder mechanism may be provided with photo-curing or thermal setting means for curing the resin material, and cooling means (used typically for a thermoplastic resin).

Although the mechanism for bringing the mold in contact with the substrate is not drawn in the apparatus drawing, it may be provided separately from or integrally with the peeling mechanism.

EXAMPLE

The present invention is now explained in further details with reference to a more specific example.

Example 1

A region of contact (resin layer 5') similar to such morphologies as depicted in FIGS. 3A and 3B was prepared. Unlike FIG. 3A, however, the region of contact is of morphology capable of approximating to a rectangle. Suppose now that the teardrop in FIG. 3A takes on a rectangular morphology.

Quartz glass having a surface size of 40×40 mm and a thickness of 6.35 mm was used to prepare a mold. A pattern depth of 50 nm and a line width/space of 50 nm/50 nm were repeated 100 times into a length of 2 mm. Four such patterns were provided, one at the center of the mold, and three 5 mm away from the center in the XY direction. In short, the concavo-convex structure region A1 may be taken as a rectangle of 10.02 mm×14 mm at the center of the mold surface.

The mold surface was coated with a releasing agent Optool DSX (Daikin Industries, Ltd.).

A silicon substrate of 0.625 mm in thickness was provided as an imprinting substrate.

A photo-curing resin material having the following composition was added drop-wise to an area of 23×33 mm larger than the concavo-convex structure region A1 at a pitch of 0.5 mm such that a rectangular resin layer morphology was obtained on a portion of the surface of the imprinting substrate corresponding to the concavo-convex structure pattern of the mold, using inkjet equipment.

(Composition of the Photo-Curing Resin Material)

Isobornyl acrylate: 38% by weight Ethylene glycol diacrylate: 20% by weight Butyl acrylate: 38% by weight 2-Hydroxy-2-methyl-1-pheyl-propan-1-one: 2% by weight 2-Perfluorodecylethyl acrylate: 1% by weight Methyl perfluorooctanolate: 1% by weight The mold having the concavo-convex structure pattern was allowed to draw near to the imprinting substrate to which the resin material was fed as described above. There was here a gap of 15 μm set between the mold at a non-concavo-convex structure region (at a site where there was none of the concavo-convex structure) and the imprinting substrate.

In that state, the mold side was irradiated with parallel light from the lighting optical system of the imprint apparatus (ultraviolet radiation having a peak wavelength of 365 nm) under the condition of 100 mJ/cm$^2$, whereby the photo-curing resin material was cured into a resin layer (the resin layer formation step of forming a resin layer having the concavo-convex structure pattern). The resin layer was obtained in a rectangular morphology.

Then, the peeling step was implemented to peel the mold off the resin layer as follows.

The region-of-contact recognition operation was implemented to recognize and determine the region of contact of the mold with the resin layer, using a CCD camera. Then, the center-of-gravity locating operation was implemented to determine the center of gravity of the morphology of the thus recognized region of contact based on that morphology. Consequently, the region of contact was found to have a size of 25 mm×35 mm, a morphology taken as being substantially equal to a rectangle, so that the center of gravity could be determined by a method of finding the point of intersection of the orthogonal lines of the rectangle.

Then, in conjunction with the center of gravity determined by the center-of-gravity locating operation, the point of force for peeling according to the invention was determined. That is, the point of force P was determined on a straight line including a line segment having the greatest length with the center of gravity G and the outermost periphery of the region of contact as two ends, and outside of the region of contact having that line segment.

The peeling operation was implemented by applying peeling (upward) force to the point of force P with the result that stress at the initial point of peeling could be reduced down to as small as 16.8N. It was thus found that 36.2N— the stress required for the conventional operation of applying uniform peeling force to the mold or the substrate in the vertical direction—can be reduced almost by half at the initial point of peeling according to the invention.

Thus, with the inventive imprint method including, in the step of peeling the mold off the material layer to be transferred, a region-of-contact recognition operation of recognizing and determining the region of contact of the mold with the material layer to be transferred, a center-of-gravity locating operation of determining the center of gravity of the morphology of the thus recognized region of contact on the basis of that morphology, and a peeling operation of determining the point of force for applying peeling force to the mold or the imprinting substrate on the basis of the thus determined center of gravity, thereby acting the peeling force on the point of force, peeling can be implemented with smaller peeling force, resulting in avoidance of inconveniences such as deposition onto the mold of the material to be transferred, i.e., the material layer to be transferred.

Especially in the invention, stresses at the initial point of peeling can be reduced by determining the positional relation of the center of gravity to the point of force. With the inventive peeling method, i.e., with peeling implemented on the basis of how to determine the point of force according to the invention, local stress can be applied to the boundary between the mold and the outer periphery of the material layer to be transferred. In addition, that stress can be applied with efficiency. The force to the region of contact concentrates primarily on the outermost periphery of the region of contact via propagation. According to the invention, however, that force can be localized on a single point on that outermost periphery so that the trigger of peeling can be pulled with small force yet with ease and for sure. Once peeling has been set off, the stress propagates over the surface of the contact of the mold with the material layer to be transferred.

Given how to determine the point of force according to the invention, the material layer to be transferred is less susceptible of tearing force during the process of peeling, because as the force propagates over the surface of contact, the resin is less susceptible of "torsion" during peeling. This in turn makes it easy to prevent the material to be transferred from getting deposited onto the mold.

It is here to noted that the present invention may be applied to the industry in the form of micro-machining or the like using nano-imprint techniques.

All the embodiments described so far herein are provided by way of exemplification but not by way of limitation; so the invention may be carried out in a variety of other modified and altered embodiments. Therefore, the scope of the present invention should be defined by what is claimed is and its equivalents.

What is claimed is:

1. An imprint apparatus, comprising:
   a mold holder for holding a mold in place,
   a substrate holder for holding an imprinting substrate in place,
   a region-of-contact measuring instrument for recognizing and determining a region of contact of the mold with a material layer to be transferred that is interposed between a surface of the mold having an concavo-convex structure region and the imprinting substrate, and
   a data processing unit operable to execute computation and command tasks for controlling a state of the mold being peeled off the material layer to be transferred,
   wherein:
      the data processing unit comprises a center-of-gravity computation portion for determining a center of gravity of a morphology of the region of contact recognized by the region-of-contact measuring instrument in a state where the mold and the material layer to be transferred are in contact with each other, and a point-of-force computation portion for determining a point of force for applying peeling force to the mold or the imprinting substrate, and
      the mold holder or the substrate holder includes a peeler, wherein the peeler is operable to apply the peeling force to the point of force.

* * * * *